(12) United States Patent
Banijamali (10) Patent No.: US 9,839,159 B1
(45) Date of Patent: Dec. 5, 2017

(54) DISPENSE PATTERN FOR THERMAL INTERFACE MATERIAL FOR A HIGH ASPECT RATIO THERMAL INTERFACE

(71) Applicant: Xilinx, Inc., San Jose, CA (US)

(72) Inventor: Bahareh Banijamali, Los Altos, CA (US)

(73) Assignee: XILINX, INC., San Jose, CA (US)

(*) Notice: Subject to any disclaimer, the term of this patent is extended or adjusted under 35 U.S.C. 154(b) by 83 days.

(21) Appl. No.: 14/842,325

(22) Filed: Sep. 1, 2015

(51) Int. Cl.
  *H05K 7/00* (2006.01)
  *H05K 7/20* (2006.01)
  *B23P 15/26* (2006.01)

(52) U.S. Cl.
  CPC ............ *H05K 7/2039* (2013.01); *B23P 15/26* (2013.01)

(58) Field of Classification Search
  CPC .............................. H05K 7/2039; B23P 15/26
  USPC ............... 361/705, 679.54, 679.46, 688, 723
  See application file for complete search history.

(56) References Cited

U.S. PATENT DOCUMENTS

| | | | | |
|---|---|---|---|---|
| 7,906,857 B1* | 3/2011 | Hoang | ................ | H01L 23/4334 257/675 |
| 9,414,530 B1* | 8/2016 | Howard | ............... | H05K 1/0207 |
| 2015/0084178 A1* | 3/2015 | Kim | ........................ | H01L 23/42 257/706 |
| 2015/0206869 A1* | 7/2015 | Kim | ........................ | H01L 23/36 438/109 |

* cited by examiner

*Primary Examiner* — Dion R Ferguson
*Assistant Examiner* — Mandeep S Buttar
(74) *Attorney, Agent, or Firm* — Joshua Hamberger Carleton Clauss (57) ABSTRACT

A pattern for heat transfer material for a thermal transfer interface having a high aspect ratio. Two thermal interface elements (e.g., a die and a cover) meet to form a thermal interface with a high aspect ratio (i.e., the ratio of length to width is above a threshold such as 9:5). The pattern includes two star-shaped patterns aligned side-by-side in the lengthwise (longer dimension) direction. Each star pattern includes spokes emanating from a local central point. The pattern optionally includes a central cross shape that includes a vertical line extending between the two longer edges and a horizontal thickened section in which horizontally aligned spokes are thickened. When pressed between two thermal interface elements, this pattern performs better (e.g., covers more area) than a more traditional pattern, thereby improving heat transfer ability.

20 Claims, 5 Drawing Sheets

DISPENSE PATTERN FOR THERMAL INTERFACE MATERIAL FOR A HIGH ASPECT RATIO THERMAL INTERFACE

TECHNICAL FIELD

Embodiments of the present invention generally relate to heat transfer interfaces, and in particular, to a dispense pattern for thermal interface material for a thermal interface with high aspect ratio.

BACKGROUND ART

Integrated circuits are often cooled with the use of heat sinks. A heat sink having a high thermal conductivity is placed in contact with the integrated circuit and is shaped in such a way that heat is efficiently carried away from the integrated circuit. At the point of contact between the integrated circuit and the heat sink (or other intermediate points of contact such as between a lid and the integrated circuit or a lid and the heat sink), a thermal interface material is typically used to improve the ability to conduct heat. When applied, the thermal interface material flows into microscopic surface irregularities and acts as a better heat transfer agent than the air or other substance that would otherwise be present.

Thermal interface material is typically applied in patterns so that when two interface elements are pressed together, the thermal interface material compresses and spreads out to cover a desired amount of interface area. Interface areas typically have a nearly square aspect ratio and patterns for application of thermal interface material for such aspect ratios exist and are effective. However, for interface areas with a high aspect ratio (i.e., a larger ratio of length to width), current patterns are inefficient and/or do not cover a sufficient amount of area.

SUMMARY

A heat transfer interface is provided. The heat transfer interface includes a first thermal interface element and a second thermal interface element together forming an interface area with a rectangular aspect ratio. The first thermal interface element has thermal interface material applied thereto, the thermal interface material being laid out in a dual star-shaped pattern that includes two star-shaped patterns of thermal interface material laid out in a longer direction of the interface area.

An integrated chip package assembly is provided. The integrated chip package assembly includes an integrated circuit die coupled to a package substrate. The integrated chip package assembly also includes a lid forming a thermal interface area having a rectangular ratio with the integrated circuit die. The integrated chip package assembly further includes a heat transfer layer disposed between the lid and the die, the heat transfer layer formed by pressing, between the integrated circuit die and the lid, a layer of thermal interface material laid out in a dual star-shaped pattern that includes two star-shaped patterns of thermal interface material laid out in a longer direction of an interface area defined between the integrated circuit die and the lid.

A method is also provided. The method includes applying thermal interface material to a first thermal interface element that forms an interface area having a rectangular aspect ratio with a second thermal interface element. The first thermal interface element has thermal interface material applied thereto, the thermal interface material being laid out in a dual star-shaped pattern that includes two star-shaped patterns of thermal interface material laid out in a longer direction of the interface area.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

Embodiments provide a pattern for heat transfer material for a thermal transfer interface having a high aspect ratio. Two thermal interface elements (e.g., a die and a cover) meet to form a thermal interface with a high aspect ratio (i.e., the ratio of length to width is above a threshold such as 9:5). The pattern includes two star-shaped patterns aligned side-by-side in the lengthwise (longer dimension) direction. Each star pattern includes spokes emanating from a local central point. The pattern optionally includes a central cross shape that includes a vertical line extending between the two longer edges and a horizontal thickened section in which horizontally aligned spokes are thickened. When pressed between two thermal interface elements, this pattern performs better (e.g., covers more area) than a more traditional pattern, thereby improving heat transfer ability.

Figure 1:
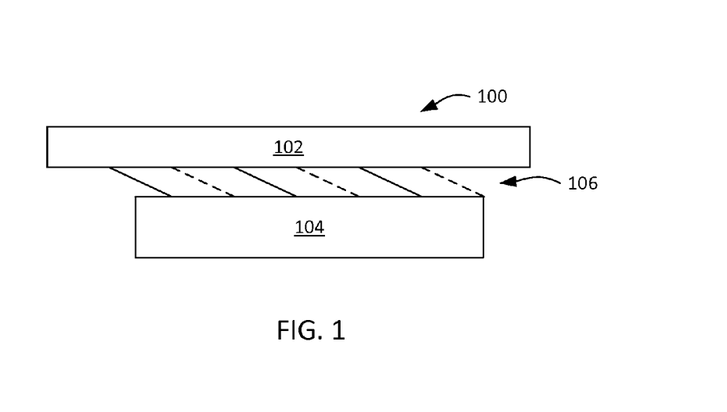
FIG. 1 is a block diagram of a heat transfer interface, according to an example.

FIG. 1 is a block diagram of a heat transfer interface 100, according to an example. As shown, the heat transfer interface 100 includes a first thermal interface element 102, a second thermal interface element 104, and a heat transfer layer 106. The first thermal interface element 102 and second thermal interface element 104 represent two elements between which a level of heat transfer is desired that is higher than that which would be provided simply by surface-to-surface contact. Examples of such pairs of elements include a computer die and a heat sink, and a computer die and a package lid. The heat transfer layer 106 is made of a heat transfer material (sometimes referred to as a "thermal interface material") that has high thermal conductivity and that can flow into surface features that contribute to uneven contact between thermal interface element 102 and thermal interface element 104. Such surface features may include, for example, small surface bumps, ridges, notches, or other features that are typically present in solid surfaces and may lead to uneven thermal contact.

To form the heat transfer layer 106, during manufacturing and/or assembly, an initial pattern of heat transfer material is applied to first thermal interface element 102 or second thermal interface element 104 and first thermal interface element 102 and second thermal interface element 104 are pressed together. Pressing the thermal interface elements together spreads the heat transfer material. Various aspects of the initial pattern of heat transfer material affect the degree to which the area of the surfaces of the first thermal interface element 102 and the second thermal interface element 104 are covered. In one example, the initial pattern of heat transfer material is a pattern of lines. The width of these lines may determine the area over which the heat transfer material spreads. Other factors that affect the degree to which area is covered by heat transfer material include the number of such lines, the particular pattern of the lines, the particular heat transfer material that is used, and other factors.

Heat transfer performance of heat transfer interfaces, such as the heat transfer interface 100 illustrated in FIG. 1, is affected by the percentage of the total area of the interface that is covered with heat transfer material. A larger coverage percentage leads to greater heat transfer performance. Circuit package designers typically specify a threshold of areal coverage that is deemed to be adequate, such as 90%.

Figure 2A:
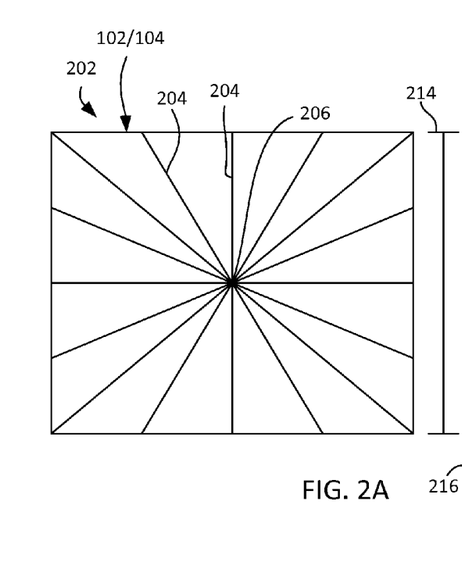
FIG. 2A illustrates a star-shaped initial pattern for heat transfer material as applied to a thermal interface element of FIG. 1, according to an example.

FIG. 2A illustrates a star-shaped initial pattern 202 for heat transfer material as applied to either first thermal interface element 102 or second thermal interface element 104, according to an example. The star-shaped initial pattern 202 includes a series of spokes 204 emanating from a central point 206. Although a particular number of spokes 204 is shown, it should be understood that the star-shaped initial pattern 202 may be modified to have any technically feasible number of spokes 204 and still be consistent with the teachings herein. Also, although the term "center" is used, the exact geometric center does not need to be the point from which the spokes emanate. Instead, a near center or other point could be the point from which the spokes emanate.

Each of the spokes 204 is a "line" of heat transfer material that has a thickness and height, as well as other dimensional and compositional characteristics. When applied to one element, such as first thermal interface element 102 or second thermal interface element 104, and after first thermal interface element 102 and second thermal interface element 104 are pressed together, the heat transfer material is spread out to occupy a greater area, as shown in FIG. 2B.

Figure 2B:
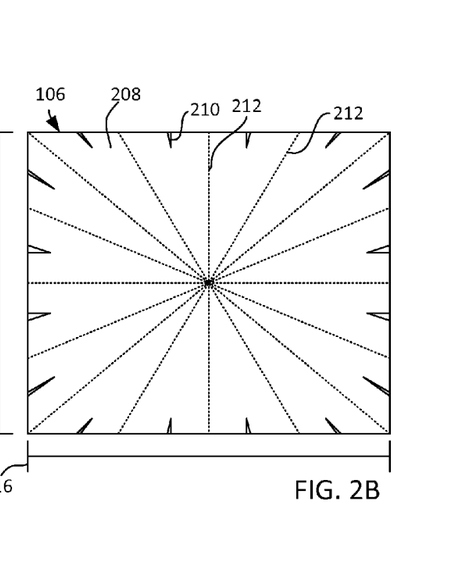
FIG. 2B illustrates a heat transfer layer that forms after the star-shaped initial pattern of heat transfer material illustrated in FIG. 2A is pressed between thermal interface elements, according to an example.

FIG. 2B illustrates a heat transfer layer 106 that forms after the star-shaped initial pattern 202 of heat transfer material illustrated in FIG. 2A is pressed between first thermal interface element 102 and second thermal interface element 104, according to an example. After pressing, the spokes 204 spread out to occupy much of the area between the first thermal interface element 102 and the second thermal interface element 104. However, due to various factors such as the specific shape of the star-shaped initial pattern 202, the width of the spokes 204, and other factors, voids 210 exist in the heat transfer layer 106. These voids 210 represent areas where heat transfer material has not spread (or has not sufficiently spread) and thus where thermal transfer performance between first thermal interface element 102 and second thermal interface element 104 is decreased as compared to other areas where heat transfer material has spread. Although some voids 210 exist in the heat transfer layer 106 illustrated in FIG. 2B, heat transfer material has spread to what is deemed to be a sufficient percentage of the area (e.g., 90%) between the first thermal interface element 102 and the second thermal interface element 104.

Note that the dashed lines 212 illustrated in FIG. 2B represent where spokes 204 had been before the heat transfer material was pressed between first thermal interface element 102 and second thermal interface element 104. The dashed lines 212 are dashed because, unlike in FIG. 2A, the heat transfer material is no longer confined to the areas corresponding to the spokes 204 in FIG. 2A but is instead spread out to a larger area of the interface (except voids 210).

As shown in FIG. 2B, a star-shaped pattern provides a good level of coverage when the aspect ratio (defined as the ratio of the width 214 divided by the length 216) is close to a square aspect ratio (i.e., 1:1). However, when the aspect ratio is farther away from square (for example, a 9:5 aspect ratio—also referred to herein as a "high aspect ratio," a "rectangular shape," or a "rectangular aspect ratio"), the star-shaped pattern may not be satisfactory.

Figure 3A:
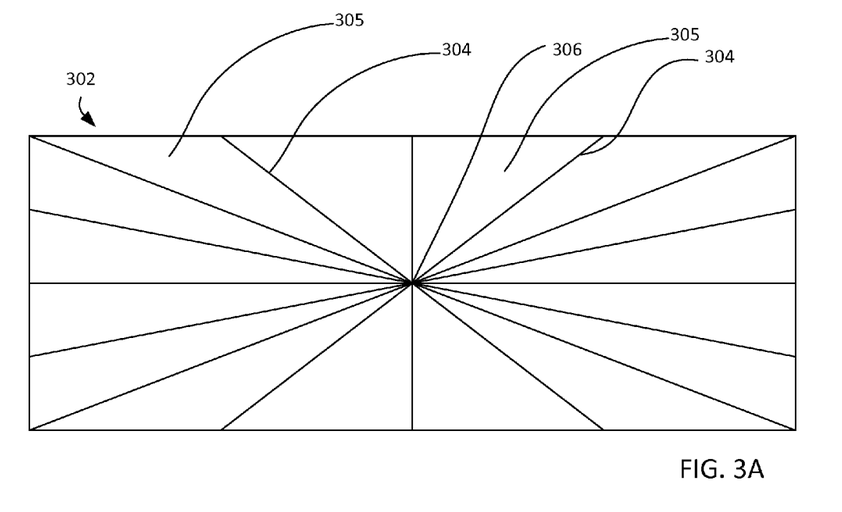
FIG. 3A illustrates a stretched star-shaped pattern of heat transfer material, laid on a thermal interface element, according to an example.

FIG. 3A illustrates a stretched star-shaped pattern 302 of heat transfer material, laid on a thermal interface element (such as first thermal interface element 102 or second thermal interface element 104), according to an example. The stretched star-shaped pattern 302 is similar to the star-shaped initial pattern 202 of FIG. 2A except that the stretched star-shaped pattern is laid on an element (e.g., first thermal interface element 102 or second thermal interface element 104) with a high aspect ratio (e.g., an aspect ratio of 9:5). Note that the pattern could be used in an interface with any aspect ratio. As with the star-shaped pattern 202 of FIG. 2A, the stretched star-shaped pattern 302 includes spokes 304 emanating from a central point 306. However, because the aspect ratio of the pattern 302 is high, intermediate areas 305—the areas between spokes 304—are larger than with the star shaped pattern 202 of FIG. 2A. This aspect of the intermediate areas 305 means that when pressed between thermal interface elements (e.g., first thermal interface element 102 and second thermal interface element 104), the percent area covered by heat transfer material is reduced as compared with the star-shaped pattern 202 of FIG. 2A.

Figure 3B:
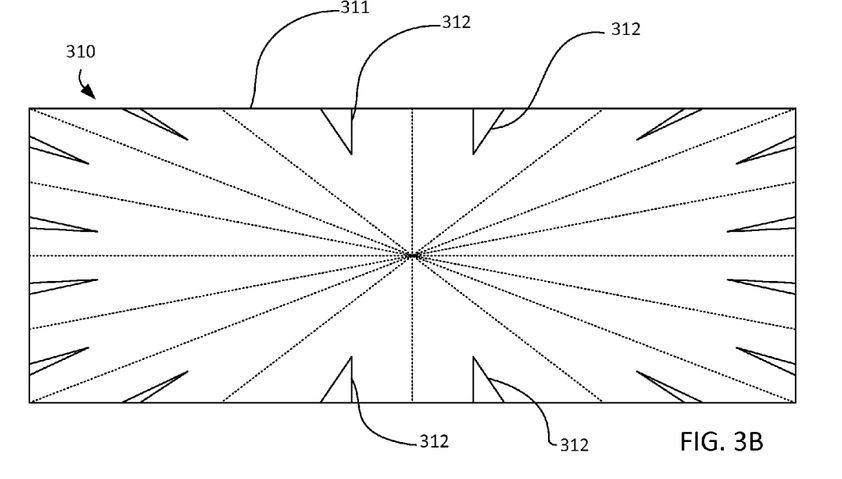
FIG. 3B shows a heat transfer layer that is formed by pressing heat transfer material in the stretched star-shaped pattern of FIG. 3A between thermal interface elements, according to an example.

FIG. 3B shows a heat transfer layer 310 that is formed by pressing heat transfer material in the stretched star-shaped pattern 302 of FIG. 3A between thermal interface elements, according to an example. As with in FIG. 2B, FIG. 3B illustrates an example pattern of spread for the heat transfer material. Specifically, heat transfer material has spread throughout the area of interface 311 between first thermal interface element 102 and second thermal interface element 104 except for within the voids 312. The area of interface 311 is defined as the area over which opposing surfaces of first thermal interface element 102 and second thermal interface element 104 overlap.

Note that the voids 312 consume a larger portion of the area of interface 311 with the stretched star-shaped pattern 302 of FIG. 3B than with the star-shaped pattern 202 of FIG. 2B. This larger void size is due to the high aspect ratio of the area of interface 311, which enlarges intermediate areas 305 (FIG. 3A) as compared with the star-shaped pattern 202 of FIG. 2B. Because a star-like pattern of heat transfer material results in less areal coverage for a high aspect ratio interface 311, a different pattern for high aspect ratio interfaces may be beneficial.

Figure 4A:
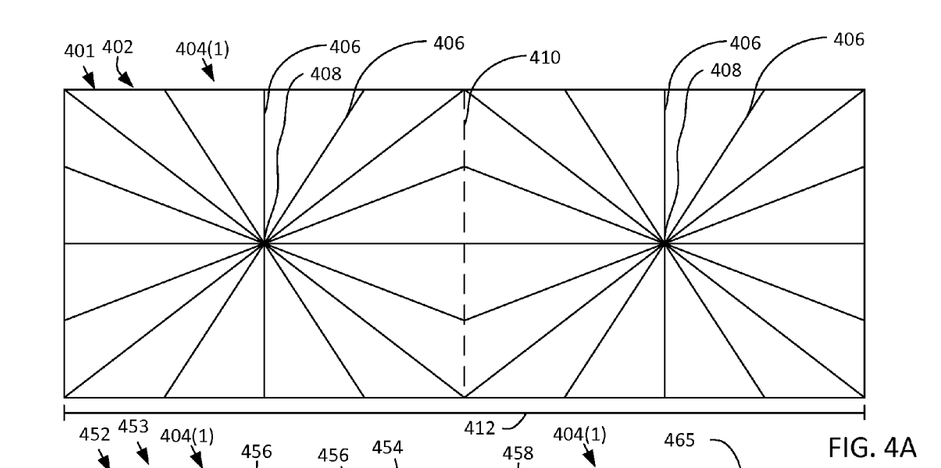
FIG. 4A illustrates a dual-star pattern of heat transfer material for formation of a heat transfer layer, according to an example.
Figure 4B:
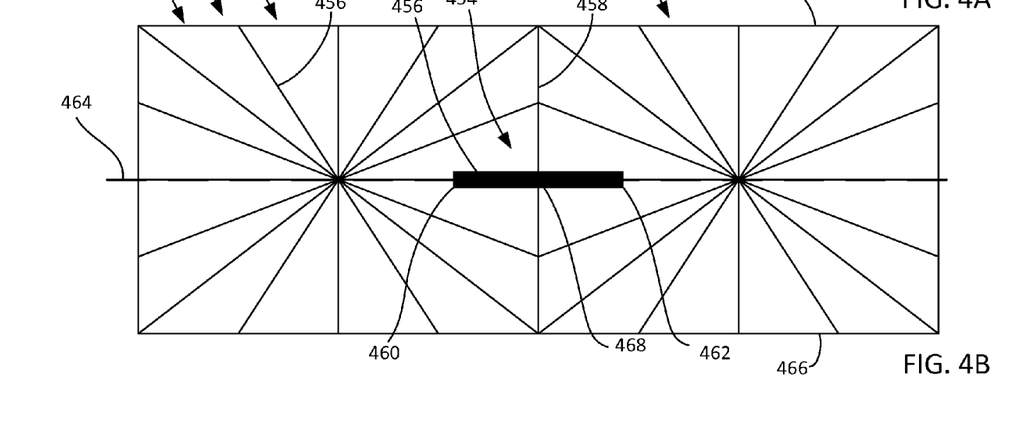
FIG. 4B illustrates an augmented dual-star pattern of heat transfer material for formation of a heat transfer layer, according to an example.

FIGS. 4A and 4B illustrate patterns of heat transfer material that provide better areal coverage for high aspect ratio thermal interfaces as compared with the stretched star-shaped pattern 302 of FIG. 3A. Instead of the stretched star-shaped pattern 302, a dual-star pattern is used. When pressed between thermal interface elements, these dual-star patterns provide better areal coverage than the stretched star-shaped pattern 302.

FIG. 4A illustrates a dual-star pattern 402 of heat transfer material for formation of a heat transfer layer, according to an example. The dual-star pattern 402 includes a first star pattern 404(1) and a second star pattern 404(2), lined up side-by-side in the lengthwise (i.e., largest dimension) direction. Each star pattern includes spokes 406 emanating from a local central point 408 (e.g., 408(1) or 408(2)) to form the two star patterns 404. A midline 410 is the border between the two star patterns 404. The midline 410 divides the length 412 (i.e., the longer dimension) of the interface area 401 so that the two star patterns 404 have lengths and widths that are closer together rather than farther apart (i.e., the star patterns 404 have dimensions that are more "square" than rectangular). Note that in FIG. 4A, the midline does not represent a place where heat transfer material is located but is instead simply a geometric indicator of a lengthwise-middle position of interface area 401.

The result of the dual-star pattern 402 is that when pressed between two thermal interface elements (e.g., elements 102 and 104), a greater percent of the interface area 401 is occupied by heat transfer material than with the stretched star-shaped pattern 302 of FIG. 3A. Thus, the dual-star pattern 402 of FIG. 4A may be used with advantage for heat transfer purposes between two heat transfer elements (e.g., 102 and 104).

FIG. 4B illustrates an augmented dual-star pattern 452 of heat transfer material for formation of a heat transfer layer, according to an example. The augmented dual-star pattern 452 of FIG. 4B is similar to the dual-star pattern 402 of FIG. 4A except that in addition to the two star patterns 404, a central cross 454 of heat transfer material is included.

The central cross 454 includes a horizontal thickened portion 456 and a vertical middle portion 458. The horizontal thickened portion is located roughly in the horizontal center of the interface area 453 and is an area of increased width of spokes 455 of the two star patterns 404. The horizontal thickened portion 456 extends from a left-most point 460 to a right-most point 462, within the horizontal midline 464 of area 453.

The vertical midline portion 458 occupies an area corresponding to the midline 410 of FIG. 4A and extends from a top edge 465 to a bottom edge 466 of area 453. This vertical midline portion 458 represents an additional area where heat transfer material is applied within area 453 The vertical midline portion 458 and horizontal thickened portion 456 cross at a center location 468, which is roughly in the center of area 453.

Note that for both the dual-star pattern 402 and the augmented dual-star pattern 452, thickness of different spokes 406/455 may be varied to fine-tune the area occupied by heat transfer material when shaped by being pressed between thermal interface elements. Thus different spokes 406/455 may have different thicknesses or may differ in other ways. The thickness of the spokes 406/455 may vary from the edge of the area 401/453 to the center of the area 401/453. Note also that the dual-star pattern 402 and augmented dual-star pattern 452 may include a number of star-shaped patterns that is different than two (such as three, four, or more).

Figure 5:
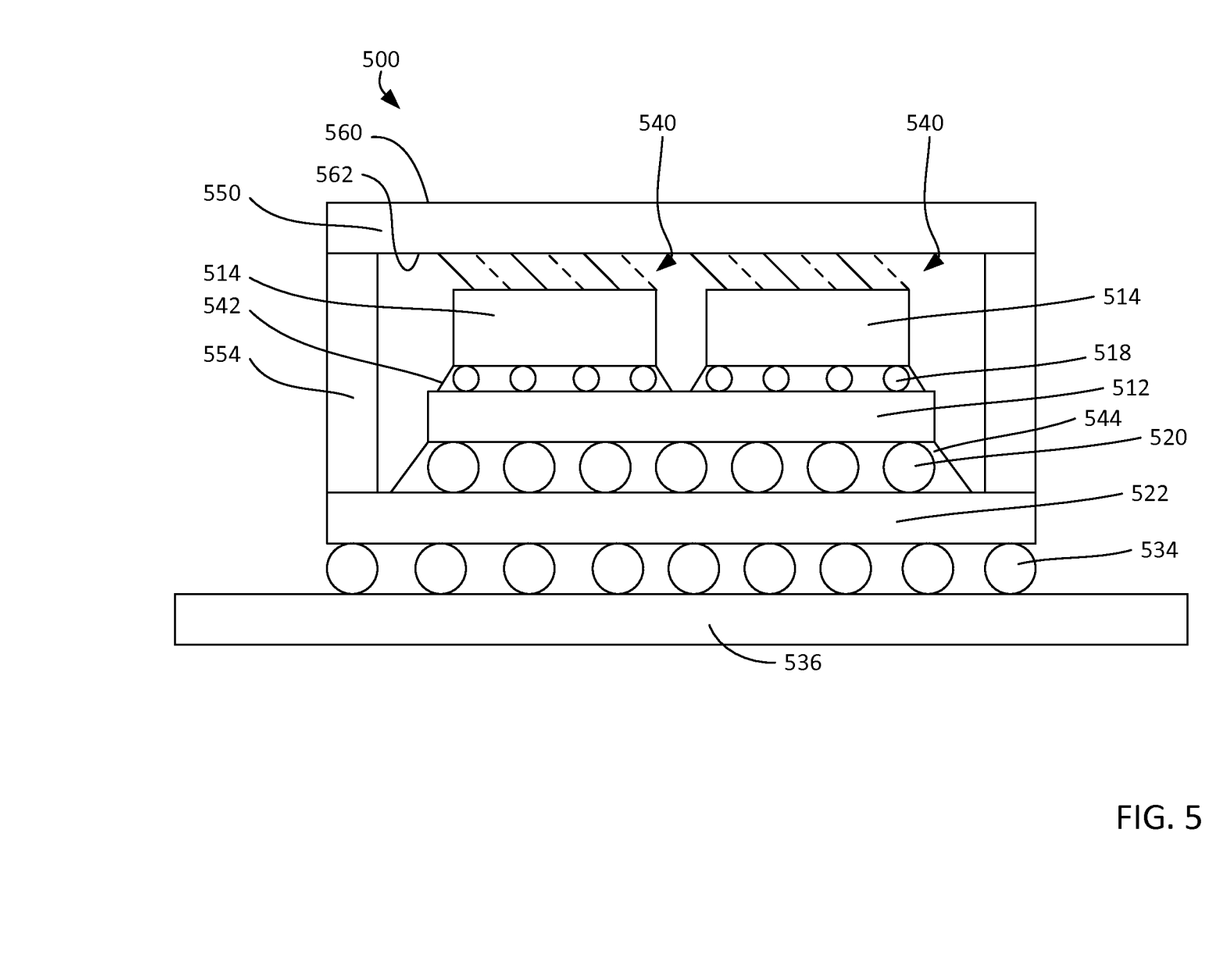
FIG. 5 is a block diagram of an integrated chip package assembly in which the heat transfer material patterns disclosed with respect to FIGS. 1-4B may be utilized, according to an example.

FIG. 5 is a block diagram of an integrated chip package assembly 500 in which the heat transfer material patterns disclosed with respect to FIGS. 1-4B may be utilized, according to an example. The chip package assembly 500 includes at least one or more IC dies 514 connected optionally by a silicon-through-via (TSV) interposer 512 to a package substrate 522. Although two IC dies 514 are shown in FIG. 5, the number of IC dies may range from one to as many as can be fit within the chip package assembly 500.

The interposer 512 includes circuitry for electrically connecting the dies 514 to circuitry of the package substrate 522. The circuitry of the interposer 512 may optionally include transistors. Package bumps 520, also known as "C4 bumps," are utilized to provide an electrical connection between the circuitry of the interposer 512 and the circuitry of the package substrate 522. The package substrate 522 may be mounted and connected to a printed circuit board (PCB) 536, utilizing solder balls 534, wire bonding or other suitable technique. An undermolding 544 may be utilized to fill the space not taken by the package bumps 520 between the PCB 536 and the interposer 512.

The IC dies 514 are mounted to one or more surfaces of the interposer 512, or alternatively in embodiments wherein an interposer is not utilized, to the package substrate 522. The IC dies 514 may be programmable logic devices, such as field programmable gate arrays (FPGA), memory devices, optical devices, processors or other IC logic structures. Optical devices include photo-detectors, lasers, optical sources, and the like. In the embodiment depicted in FIG. 5, the IC dies 514 are mounted to a top surface of the interposer 512 by a plurality of micro-bumps 518. The micro-bumps 518 electrically connect the circuitry of each IC die 514 to circuitry of the interposer 512. The circuitry of the interposer 512 connects the micro-bumps 518 to selective package bumps 520, and hence, connects selective circuitry of each IC die 514 to the package substrate 522, to enable communication of the dies 514 with the PCB 536 after the chip package assembly 500 is mounted within an electronic device (not shown). When the optional interposer 512 is not present, the micro-bumps 518 connect selective circuitry of each IC die 514 to the package substrate 522 to enable communication of the dies 514 with the PCB 536. An undermolding 542 may be utilized to fill the space not taken by the micro-bumps 518 between the dies 514 and interposer 512.

The chip package assembly 500 additionally includes a stiffener 554. The stiffener 554 is coupled to the package substrate 522 and circumscribes the IC dies 514. The stiffener 554 can extend to peripheral edges of the package substrate 522 to provide mechanical support which helps prevent the chip package assembly 500 from bowing. The stiffener 554 may be a single layer structure or a multi-layer structure. The stiffener 554 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 554 can also be made of organic materials such as copper-clad laminate.

A lid 550 is disposed over the dies 514. To receive heat from the dies 514, the lid 550 may be fabricated from a thermally conductive material, such as copper, nickel-plated copper or aluminum, among other suitable materials. The lid 550 may have a thickness of between about 0.5 mm and about 3.0 mm, although other thicknesses may be utilized.

The lid 550 has a first surface 560 and a second surface 562. The first surface 560 forms the exterior top surface of the chip package assembly 500, while the second surface 562 faces the dies 514. A heat sink, not shown, may optionally be mounted to the first surface of the lid 550. The second surface 562 of the lid 550 may be coupled to the stiffener 554. For example, the second surface 562 of the lid 550 may be coupled to the stiffener 554 by an adhesive (not shown), such as an epoxy.

A heat transfer layer 540 is disposed between lid 550 and dies 514. The heat transfer layer 540 may be selected to provide a thermally conductive path between the lid 550 to the dies 514 so that heat generated by the dies 514 may be dissipated through the lid 550. The heat transfer layer 540 may be a soft or compliant adhesive to allow compensation between mismatched heights of neighboring dies 514 within the chip package assembly 500. In one example, the heat transfer layer 540 may be a thermal gel or thermal epoxy, such as for example, packaging component attach adhesives available from AI Technology, Inc., located in Princeton Junction, N.J.

The heat transfer layer 540 may be made by applying a pattern of heat transfer material as described in any of FIGS. 1-4B to a die 514 or lid 550. For example, a dual-star pattern of FIG. 4A or an augmented dual-star pattern of FIG. 4B may be applied to either die 514 or lid 550 and those two elements may be pressed together.

Figure 6:
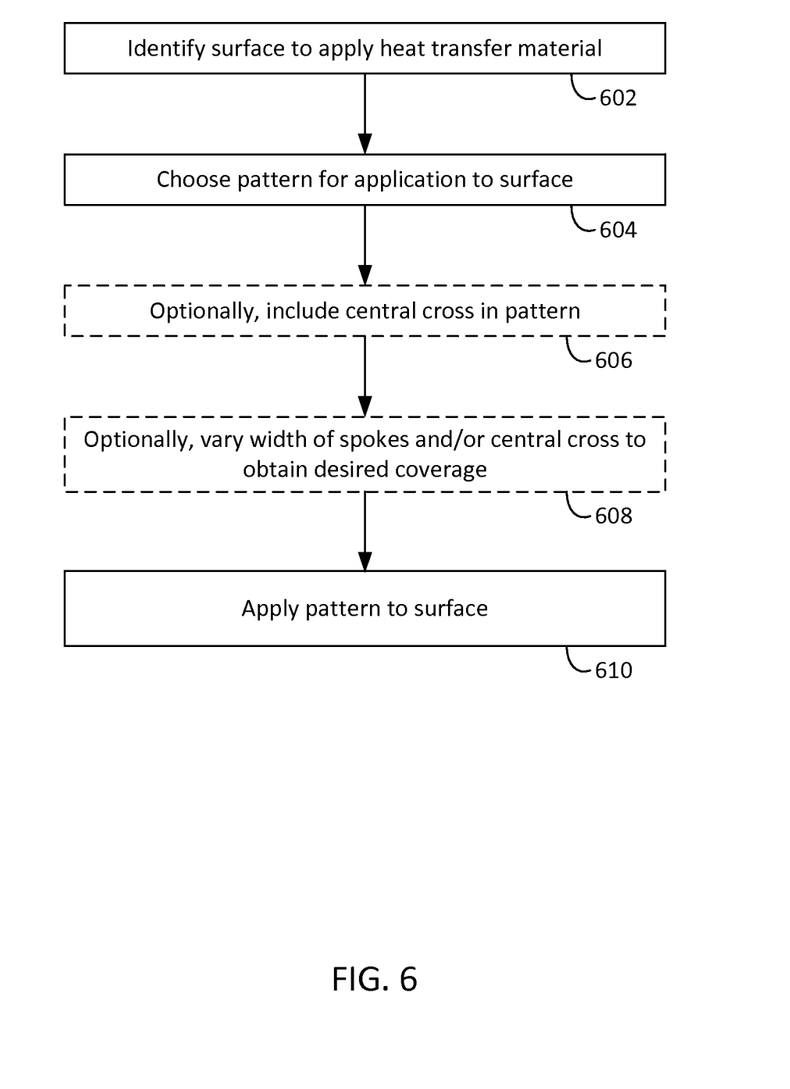
FIG. 6 is a flow diagram of a method for laying a heat transfer layer on a thermal interface element, according to an example.

FIG. 6 is a flow diagram of a method 600 for laying a heat transfer layer on a thermal interface element, according to an example. Although described in conjunction with the system of FIG. 1-5, those of skill in the art will realize that any entity that performs the operations described, in any technically feasible order, would be within the scope of the present disclosure.

As shown, a method 600 begins at operation 602, where a surface where heat transfer material is to be applied is identified. The surface may be, for example, the surface of a die, the surface of the lid of an integrated circuit package, or the surface of a heat sink. The area of interface between the surface and a surface with which a thermal interface is to be formed preferably has a high aspect ratio (e.g., 45:25).

At operation 604, a pattern of heat transfer material is chosen for application to the surface. The pattern includes two star-shaped portions. Each star-shaped portion includes spokes emanating from a local center. The two star-shaped portions are laid out side-by-side in the direction of the longer dimension of the area of interface so that the star-shaped portions have a more square-like outline, rather than a more rectangular or stretched outline.

At operation 606, a central cross portion is optionally included in the pattern. The central cross includes a horizontal thickened portion that crosses a vertical middle portion. The horizontal thickened portion is a thickening in spokes of the two star-shaped portions. The vertical middle portion is a vertical line (i.e., running between the two longer edges of the interface area) at which heat transfer material is to be applied. The central cross portion may be added if heat transfer material at corresponding locations in the interface area is needed to reach the coverage threshold.

At operation 608, optionally, the widths of spokes of the star-shaped portions and/or central cross may be varied to obtain desired coverage within the interface area. Each spoke and the two portions of the central cross may have different thicknesses. At operation 610, the pattern is applied to the surface. This may be done with an appropriate apparatus such as a dispenser with a head having a nozzle operable to dispose the thermal interface material to the surface.

Optionally, operations 604-608 may be a single operation or any number of operations. For example, the pattern chosen in operation 604 may include a central cross and may have varying widths for the different spokes. In another example, the chosen pattern may have varying widths for the spokes but may not have a central cross.

The heat transfer material dispense pattern described above advantageously provides better coverage with heat transfer material for high aspect ratio heat transfer interfaces than previous patterns. The better coverage improves heat transfer performance, thus improving die life and performance by allowing for better heat transfer ability than with previous dispense patterns.

While the foregoing is directed to embodiments of the present invention, other and further embodiments of the invention may be devised without departing from the basic scope thereof, and the scope thereof is determined by the claims that follow.

What is claimed is:

1. A method, comprising: applying thermal interface material to a first thermal interface element that forms an interface area having a rectangular aspect ratio with a second thermal interface element, wherein the first thermal interface element has thermal interface material applied thereto, the thermal interface material being laid out in a dual star-shaped pattern that includes two star-shaped patterns of thermal interface material laid out in a longer direction of the interface area such that respective local centers of the two star-shaped patterns are disposed on a common axis that is parallel to the longer direction and wherein the thermal interface material for both of the two start-shaped patterns extends to a midline which is disposed on the interface area that is perpendicular to the common axis.

2. The method of claim 1, wherein applying the thermal interface material to the first thermal interface element comprises applying the dual star-shaped pattern having wherein each star includes a set of spokes emanating from the respective local center.

3. The method of claim 2, wherein applying the thermal interface material to the first thermal interface element further comprises applying the dual star-shaped pattern that further includes a central cross.

4. The method of claim 3, wherein applying the thermal interface material to the first thermal interface element further comprises applying the dual star-shaped pattern that includes the central cross that includes a vertical portion that extends between two longer edges of the interface area and a horizontal thickened portion.

5. The method of claim 4, wherein applying the thermal interface material to the first thermal interface element further comprises applying the dual star-shaped pattern in which a first width of one of the spokes differs from a second width of a different one of the spokes.

6. The method of claim 1, further comprising pressing the thermal interface material between the first thermal interface element and the second thermal interface element.

7. A heat transfer interface, comprising: a first thermal interface element and a second thermal interface element together forming an interface area with a rectangular aspect ratio, wherein the first thermal interface element has thermal interface material applied thereto, the thermal interface material being laid out in a dual star-shaped pattern that includes two star-shaped patterns of thermal interface material laid out in a longer direction of the interface area such that respective local centers of the two star-shaped patterns are disposed on a common axis that is parallel to the longer direction and wherein the thermal interface material for both of the two start-shaped patterns extends to a midline which is disposed on the interface area that is perpendicular to the common axis.

8. The heat transfer interface of claim 7, wherein each star includes a set of spokes emanating from the respective local center.

9. The heat transfer interface of claim 8, wherein the dual star-shaped pattern further includes a central cross.

10. The heat transfer interface of claim 9, wherein the central cross includes a vertical portion that extends between two longer edges of the interface area and a horizontal thickened portion.

11. The heat transfer interface of claim 10, wherein a first width of one of the spokes differs from a second width of a different one of the spokes.

12. The heat transfer interface of claim 7, wherein:
the first thermal interface element comprises a computer die; and
the second thermal interface element comprises a package lid.

13. The heat transfer interface of claim 7, wherein the rectangular aspect ratio comprises a ratio of approximately 9 to 5.

14. The heat transfer interface of claim 7, wherein:
the first thermal interface element is pressed against the second thermal interface element.

15. An integrated chip package assembly, comprising: an integrated circuit die coupled to a package substrate; a lid forming a thermal interface area having a rectangular ratio with the integrated circuit die; and a heat transfer layer disposed between the lid and the die, the heat transfer layer formed by pressing, between the integrated circuit die and the lid, a layer of thermal interface material laid out in a dual star-shaped pattern that includes two star-shaped patterns of thermal interface material laid out in a longer direction of an interface area defined between the integrated circuit die and the lid such that respective local centers of the two star-shaped patterns are disposed on a common axis that is parallel to the longer direction, and wherein the thermal interface material for both of the two start-shaped patterns extends to a midline which is disposed on the interface area that is perpendicular to the common axis.

16. The integrated chip package assembly of claim 15, wherein each star includes a set of spokes emanating from the respective local center.

17. The integrated chip package assembly of claim 16, wherein the dual star-shaped pattern further includes a central cross.

18. The integrated chip package assembly of claim 17, wherein the central cross includes a vertical portion that extends between two longer edges of the interface area and a horizontal thickened portion.

19. The integrated chip package assembly of claim 18, wherein a first width of one of the spokes differs from a second width of a different one of the spokes.

20. The integrated chip package assembly of claim 15, wherein the rectangular ratio comprises a ratio of approximately 9 to 5.

* * * * *